US007057216B2

(12) United States Patent
Ouyang et al.

(10) Patent No.: US 7,057,216 B2
(45) Date of Patent: Jun. 6, 2006

(54) HIGH MOBILITY HETEROJUNCTION COMPLEMENTARY FIELD EFFECT TRANSISTORS AND METHODS THEREOF

(75) Inventors: Qiqing Christine Ouyang, Yorktown Heights, NY (US); Xiangdong Chen, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/698,122

(22) Filed: Oct. 31, 2003

(65) Prior Publication Data

US 2005/0093021 A1    May 5, 2005

(51) Int. Cl.
*H01L 29/778* (2006.01)
(52) U.S. Cl. ........................................ 257/194; 257/628
(58) Field of Classification Search ................ 257/628, 257/194, 195, 192
See application file for complete search history.

(56) References Cited

U.S. PATENT DOCUMENTS

| 3,599,010 | A | * | 8/1971 | Crawford | ....................... | 377/79 |
| 5,818,076 | A | * | 10/1998 | Zhang et al. | ................ | 257/255 |
| 6,274,894 | B1 | * | 8/2001 | Wieczorek et al. | ......... | 257/192 |
| 6,319,799 | B1 | * | 11/2001 | Ouyang et al. | ............. | 438/528 |
| 6,406,951 | B1 | * | 6/2002 | Yu | .............................. | 438/183 |
| 6,724,019 | B1 | * | 4/2004 | Oda et al. | .................... | 257/195 |

OTHER PUBLICATIONS

Ouyang et al, "A Novel Si/SiGe . . . Current" IEEE Transactions On Electron Devices vol. 47 No. 10 Oct. 2000. pp. 1943-1949.*

* cited by examiner

Primary Examiner—Jerome Jackson
(74) Attorney, Agent, or Firm—George Sai-Halasz; Wan Yee Cheung (57) ABSTRACT

In all representative embodiments presented, the Ge concentration in the source and drain 10 and the SiGe epitaxial channel layer 20 is in the 15% to 50% range, preferably between about 20% to 40%. The SiGe thicknesses in the source/drain 10 are staying below the critical thickness for the given Ge concentration. The critical thickness is defined such that above it the SiGe will relax and defects and dislocations will form. The thickness of the SiGe epitaxial layer 20 typically is between about 5nm and 15nm. The thickness of the epitaxial Si layer 30 is typically between about 5nm and 15nm. FIG. 1A shows an embodiment where the body is bulk Si. These type of devices are the most common devices in present day microelectronics. FIGS. 1B and 1C show representative embodiment of the heterojunction source/drain FET device when the Si body 40 is disposed on top of an insulating material 55. This type of technology is commonly referred to as silicon on insulator (SOI) technology. The insulator material 55 usually, and preferably, is $SiO_2$. FIG. 1B shows an SOI embodiment where the body 40 has enough volume to contain mobile charges. Such SOI devices are called partially depleted devices. FIG. 1C shows an SOI embodiment where the volume of the body 40 is insufficient to contain mobile charges. Such SOI devices are called fully depleted devices. For devices shown in FIG. 1B and 1C there is, at least a thin, layer of body underneath the source and drain 10. This body material serves as the seed material onto which the epitaxial SiGe source and drain 10 are grown. In an alternate embodiment, shown in FIG. 1D. for extremely thin fully depleted SOI devices, one could grow the source and drain 10 laterally, from a lateral seeding, in which case the source and drain 10 would penetrate all the way down to the insulating layer 55.

18 Claims, 7 Drawing Sheets

HIGH MOBILITY HETEROJUNCTION COMPLEMENTARY FIELD EFFECT TRANSISTORS AND METHODS THEREOF

FIELD OF THE INVENTION

The present invention relates to electronic devices and systems. In particular it relates to field effect devices, and a method of producing such structures, with a heterojunction source/drain which substantially coincides with the metallurgical junction between the source/drain and the device body.

BACKGROUND OF THE INVENTION

Today's integrated circuits include a vast number of devices. Smaller devices are key to enhance performance and to improve reliability. As MOS (Metal Oxide Semiconductor Field-Effect-Device, a name with historic connotations meaning in general an insulated gate Field-Effect-Device) devices are being scaled down, the technology becomes more complex and new methods are needed to maintain the expected performance enhancement from one generation of devices to the next.

Silicon MOS scaling has become a major challenge in the semiconductor industry. Traditional techniques start to fail in reducing certain undesirable physical effects as device dimensions shrink down to the nanometer regime. For example, anti-punchthrough or halo implantation is used to reduce the short-channel effects. However, the abrupt doping profiles are difficult to achieve due to temperature enhanced diffusion, and these highly doped channels or pocket implant regions not only increase junction capacitance and band-to-band tunneling, but also degrades carrier mobility in the channel.

Band-gap engineering, namely introducing new materials into Si processing with different energy bands than Si, gives an important additional degree of freedom in device design. Among such new materials the SiGe alloy is one of the prominent members. The growth of high-quality compressively strained SiGe material by molecular beam epitaxy (MBE), or various types of chemical vapor deposition (CVD), allows incorporation of band-gap engineering concepts into a mature silicon technology.

A novel way to reduce short-channel effects is to have a built-in energy barrier at the source/body junction. As the height of the heterojunction barrier does not depend on the applied bias, it can resist the drain induced barrier lowering (DIBL). The band offset provided by SiGe heterojunction is mostly in the valence band, and it is very suitable for using such an effect for PFETs. (In the following the terms PFET and PMOS, as well as the terms of NFET and NMOS will used interchangeably.)

Heterojunction MOSFETs (HJMOSFETs) have been disclosed, for example, in U.S. Pat. No. 6,319,799 B1 "High Mobility Heterojunction Transistor and Method" by Q. Ouyang, et al. and in a simulation study in "A Novel Si/SiGe Heterojunction pMOSFET with Reduced Short-Channel Effects and Enhanced Drive Current," IEEE Transactions on Electron Devices, V. 47, p. 1943 (2000), by Q. Ouyang, et al. This latter reference showed that the SiGe/Si heterojunction and the dopants metallurgical junction have to coincide with each other to a relatively high precision, or the p-dopant has to be contained within the SiGe regions, in order to maintain the valance band offset between the source and body. Only when such precision is achieved can the heterojunction be effectively used to reduce the off state leakage and short-channel effects. Hitherto there was no method to give the desired coincidence of the heterojunction and the metallurgical junction, and no lateral device structure with such coincidence has been disclosed.

SUMMARY OF THE INVENTION

The present invention describes heterojunction source/drain MOSFET devices in which the PMOS is a buried SiGe channel device, while the NMOS is a surface silicon channel device. According to one aspect of the invention, the heterojunction and metallurgical junction of the device substantially coincide to within a close tolerance. Another aspect of the invention relates to a method comprising forming heterojunction source/drain by epitaxial deposition. The new heterojunction source/drain MOSFET devices can be realized in silicon on insulator (SOI), or in bulk Si technologies. The SiGe epitaxial source/drain will be compressively-strained due to lattice constant mismatch between Si and SiGe. Also, since the hole current in the PMOS will be primarily confined to a buried compressively strained SiGe channel, due to the high hole mobility in such a materials, this PMOS device can have potentially similar current carrying capability as the NMOS device. The high quality PMOS leads to excellent CMOS circuit capabilities for building processors.

In accordance with the objectives listed above, the present invention describes Si based MOSFET devices with a SiGe heterojunction source/drain where the heterojunction and the metallurgical junction of the source/drain and Si body are coinciding with a minimal tolerance.

It is a further object of the present invention to teach a method for any field effect device for processing a heterojunction source and drain with a minimal tolerance in the heterojunction and the metallurgical junction lineup.

It is a further object of the present invention to teach processors which comprise chips containing such field effect devices having heterojunction source and drain with a minimal tolerance in the heterojunction and the metallurgical junction lineup.

BRIEF DESCRIPTION OF THE DRAWINGS

These and other features of the present invention will become apparent from the accompanying detailed description and drawings, wherein.

DETAILED DESCRIPTION OF THE INVENTION

FIG. 1 schematically shows exemplary embodiments of a Si based heterojunction source/drain field device. Each embodiment contains the feature of the source 10 and drain 10 of the field effect device (FET) forming a heterojunction with the body 40 of the device. As every FET, the device has (at least one) gate 52. The conductive gate 52 in state of the art technologies is protected by a cover layer 51, which in Si based technologies is typically oxide and SiN. The gate 52 is electrically isolated from the rest of the device by the gate dielectric 53. The common property of FET-s is that the gate 52, by capacitive coupling across the gate insulator 53, controls the flow of the device current between the source 10 and drain 10. Insulator regions 54 serve for isolating the device. Typically the isolation is accomplished by shallow trenches 54, usually made of $SiO_2$, as shown in the figures.

The material of the structure shown on FIG. 1 belongs in the broad category of Si based materials. In microelectronics technology the material that has progressed the farthest in miniaturization is silicon (Si). Si based materials are various alloys of Si in the same basic technological content as Si. One such Si based material of importance for microelectronics is the silicon-germanium (SiGe) alloy. SiGe has a larger lattice constant than Si, increasingly so with increasing Ge concentration. Accordingly, when SiGe is epitaxially grown or deposited on Si it is under compressive strain. The bandgap of SiGe is smaller than that of Si. The higher the Ge content the smaller the SiGe bandgap. At a Si-SiGe heterostructure the bandgap difference is almost exclusively accommodated in the valence band. In the conduction band the band-discontinuity is almost negligible. In an FET having a source and a drain in a heterojunction relationship with the device body has advantages for miniaturization of the device. Also, having a channel consisting of strained SiGe material is very advantageous for carrier mobility, especially for holes. The reasons for such advantages and their details can be found in publications: "A Novel Si/SiGe Heterojunction pMOSFET with Reduced Short-Channel Effects and Enhanced Drive Current," IEEE Transactions on Electron Devices, V. 47, p. 1943 (2000), by Q. Ouyang, et al. Also, a PMOS with SiGe heterojunction source/drain and SiGe channel was disclosed in the U.S. Pat. No. 6,319,799 B 1 "High Mobility Heterojunction Transistor and Method" to Q. Ouyang, et al., incorporated herein by reference.

In the representative embodiments shown on FIG. 1 the device has a crystalline body 40 essentially consisting of Si. A SiGe layer 20 is epitaxially disposed on the body 40. The terms "epitaxially", "epitaxy", "epi" etc. carry their customary usage: meaning the single crystal lattice structure carries across an interface. Typically a single crystal material forms a platform onto which another single crystal material, with matching crystalline characteristics, is deposited by one of several techniques known in the art. Such techniques are, for instance, molecular beam epitaxy (MBE), or various types of chemical vapor depositions (CVD). Because of the lattice constant relationship between the SiGe layer 20 and the Si body 40 the SiGe layer 20 is under compressive strain. Such a strain enhances significantly the hole mobility. On top of the SiGe layer 20 a Si layer 30 is epitaxially disposed. This Si layer 30, for example, can serve one or more purposes such as: 1) as a channel for electron type device current; 2) allows for growth of good quality gate dielectric 53, typically of $SiO_2$, possibly in a mixture with SiN; or 3) as a protective layer to minimize contamination of the SiGe layer 20.

The border surface between the crystalline Si body 40 and the SiGe source and drain 10, which are in an epitaxial relation with the Si body, form a heterojunction interface 11. The term heterojunction means that two dissimilar materials meet and the energy bands have abrupt discontinuity at that interface 11. There is another interface of importance in the device, which is called a metallurgical junction. This is the surface, shown with a dashed lined 65 in the embodiments of FIG. 1., where the conductivity type changes between the body 40 and the source and drain 10. The body 40 and the source/drain have opposite conductivity type. If the source/drain 10 is p-type then the body is n-type, and vice versa, if the source/drain 10 is n-type then the body is p-type. Where the two type of dopants, the p-type, such as boron (B), and n-type, such as phosphorous (P), or arsenic (As), balance each other out, that is the location of the metallurgical junction 65 between the body region 40 and the source/drain region 10. In order for the potential advantages of a heterojunction source/drain to materialize, it is preferable that the heterojunction 11 substantially coincides with the metallurgical junction. Thus, one aspect of the present invention provides a method of fabricating the representative FET device embodiments of FIG. 1 with the heterojunction 11 and the metallurgical junction 65 coinciding with a tolerance of less than about 10 nm, and preferably less than about 5 nm. Although in FIGS. 1A, 1B, and 1C the metallurgical junction is shown on the body 40 side of the heterojunction 11, in reality it can be on the source/drain 10 side of the heterojunction 11 as well. The main point is that the two are coinciding with a minimal tolerance.

Figure 1A:
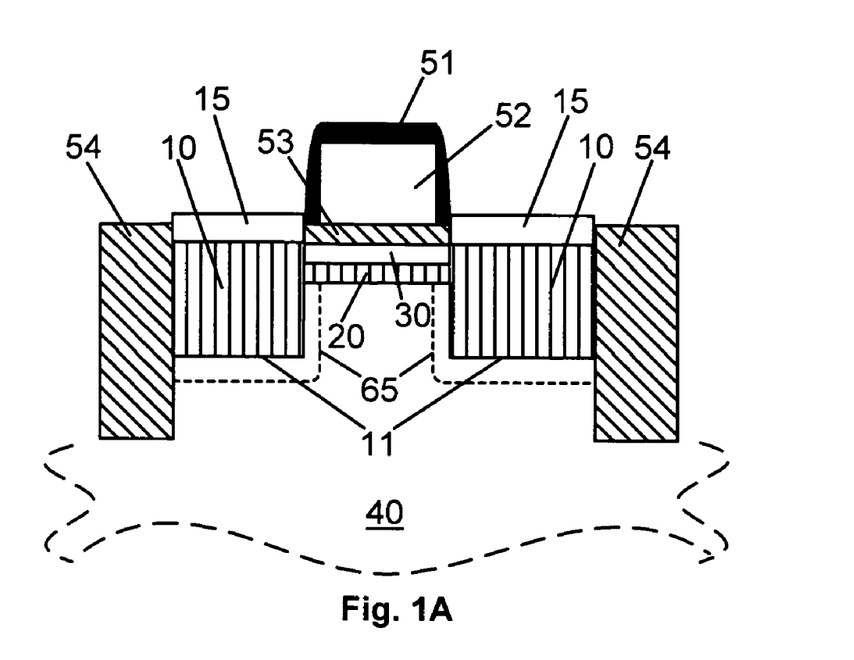
FIG. 1A–1D schematically shows exemplary embodiments of a Si based heterojunction source/drain field device.
Figure 1B:
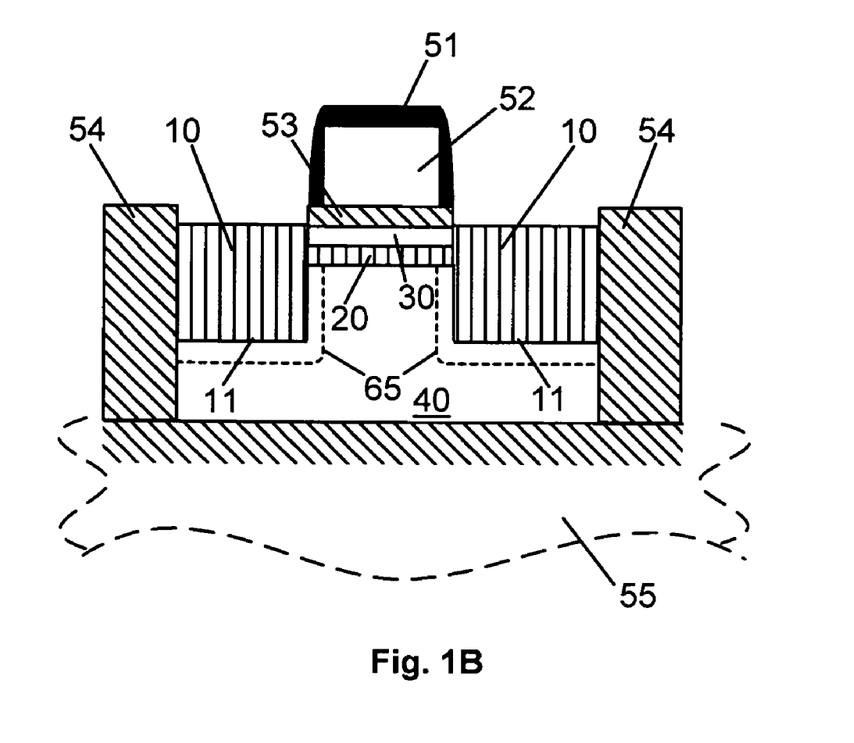
Figure 1C:
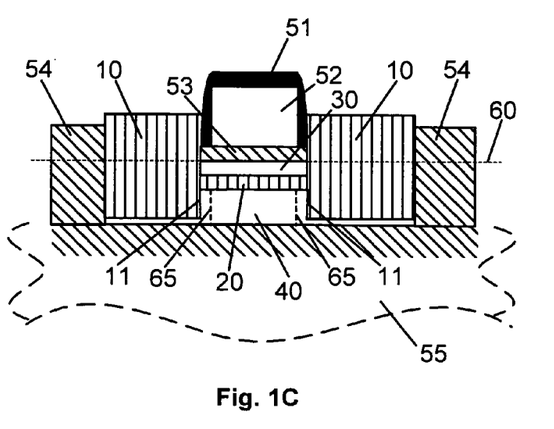
Figure 1D:
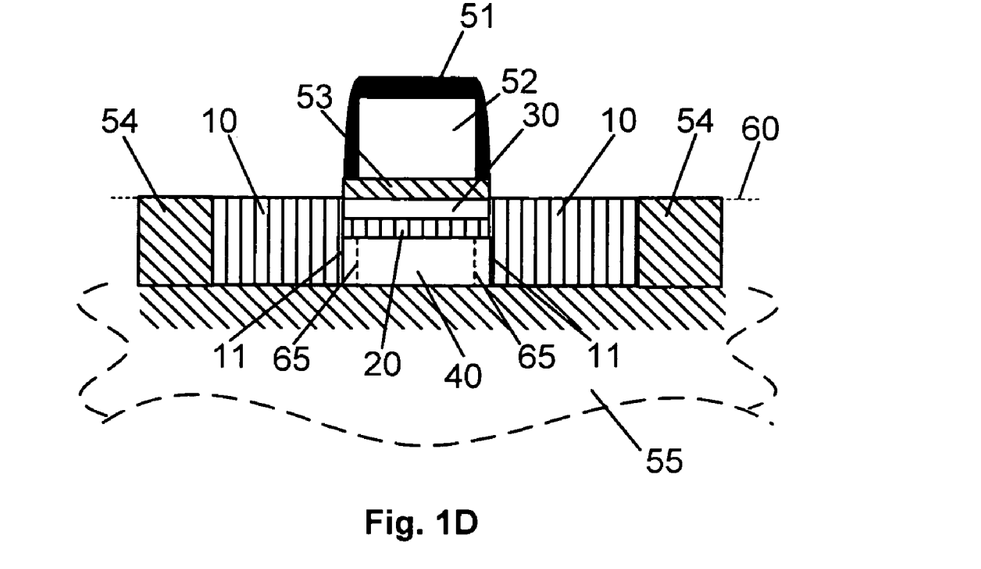

In all representative embodiments presented, the Ge concentration in the source and drain 10 and the SiGe epitaxial channel layer 20 is in the 15% to 50% range, preferably between about 20% to 40%. The SiGe thicknesses in the source/drain 10 are staying below the critical thickness for the given Ge concentration. The critical thickness is defined such that above it the SiGe will relax and defects and dislocations will form. The thickness of the SiGe epitaxial layer 20 typically is between about 5 nm and 15 nm. The thickness of the epitaxial Si layer 30 is typically between about 5 nm and 15 nm. FIG. 1A shows an embodiment where the body is bulk Si. These type of devices are the most common devices in present day microelectronics. FIGS. 1B and 1C show representative embodiment of the heterojunction source/drain FET device when the Si body 40 is disposed on top of an insulating material 55. This type of technology is commonly referred to as silicon on insulator (SOI) technology. The insulator material 55 usually, and preferably, is $SiO_2$. FIG. 1B shows an SOI embodiment where the body 40 has enough volume to contain mobile charges. Such SOI devices are called partially depleted devices. FIG. 1C shows an SOI embodiment where the volume of the body 40 is insufficient to contain mobile charges. Such SOI devices are called fully depleted devices. For devices shown in FIGS. 1B and 1C there is, at least a thin, layer of body underneath the source and drain 10. This body material serves as the seed material onto which the epitaxial SiGe source and drain 10 are grown. In an alternate embodiment, for extremely thin fully depleted SOI devices, one could grow the source and drain 10 laterally, from a lateral seeding, in which case the source and drain 10 would penetrate all the way down to the insulating layer 55.

FIG. 1A shows an additional feature of representative embodiments a Si cap layer 15 on top of the SiGe source and drain 10. The purpose of such a Si cap layer 15 is mainly to facilitate better electrical contact to the source and drain 10. The thickness of the Si cap layer can be relatively relaxed, typically between about 2 nm and about 30 nm. This Si cap layer 15 is typically formed epitaxially on the SiGe source and drain 10, immediately following the SiGe epitaxial growth. Although the Si cap layer 15 is indicated only in FIG. 1A, somebody skilled in the art would understand, that it can be part of the other representative embodiments, as well.

Since the fully depleted SOI devices as in FIG. 1C have a shallow profile, it can be advantageous to have a so called raised source/drain 10 in such structures for reducing source/drain series resistance. FET devices have a well defined surface plane, shown by the dashed line 60. This top surface plane approximately passes across the interface between the gate dielectric 53 and silicon layer 30. For the fully depleted SOI FET of FIG. 1C the source 10 and drain 10 are raising above the top surface plane, yielding the desired advantages.

In the representative embodiments shown in FIG. 1, the Si body 40 can have n-type conductivity, namely the device is a PFET, and in these devices a hole device current flow, as a consequence of the heterojunction discontinuity in the valence band, is confined predominantly in the SiGe layer 20. Since a heterojunction 11 is desirable between a body 40 and a source/drain 10, but it could be disadvantageous if it formed a barrier in the path of the device current, it is desirable for the SiGe layer 20 to substantially equal the Ge concentration of the SiGe in the source 10 and the drain 10. With substantially equal Ge concentrations, the holes can pass between the source 10 and drain 10 an the SiGe layer 20 without hindrance.

Alternatively, the Si body 40 can have p-type conductivity, namely the device is an NFET. For these devices, the electron device current flow, as a consequence of the lack of heterojunction discontinuity in the conduction band, is confined predominantly in the Si layer 30.

Figure 2A:
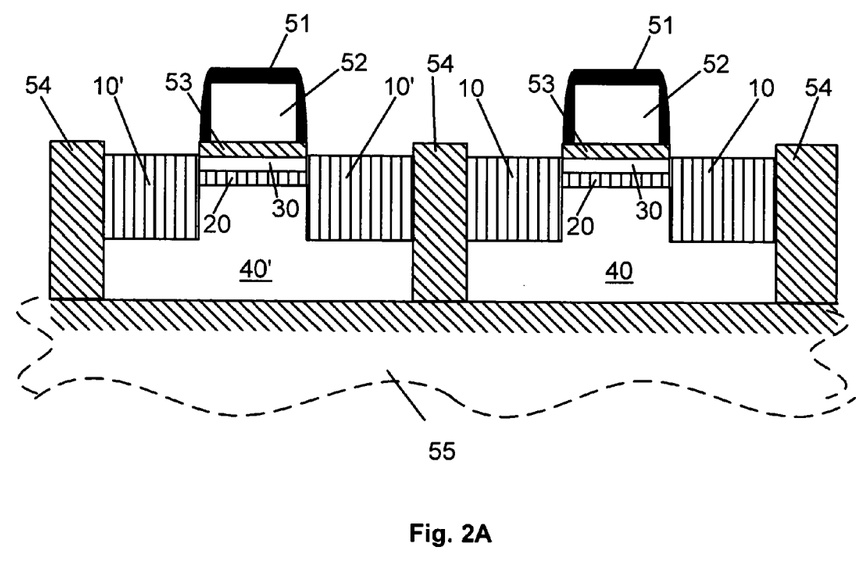
FIG. 2A–2B schematically shows exemplary embodiments of a Si based heterojunction source/drain field device in complementary configurations.
Figure 2B:
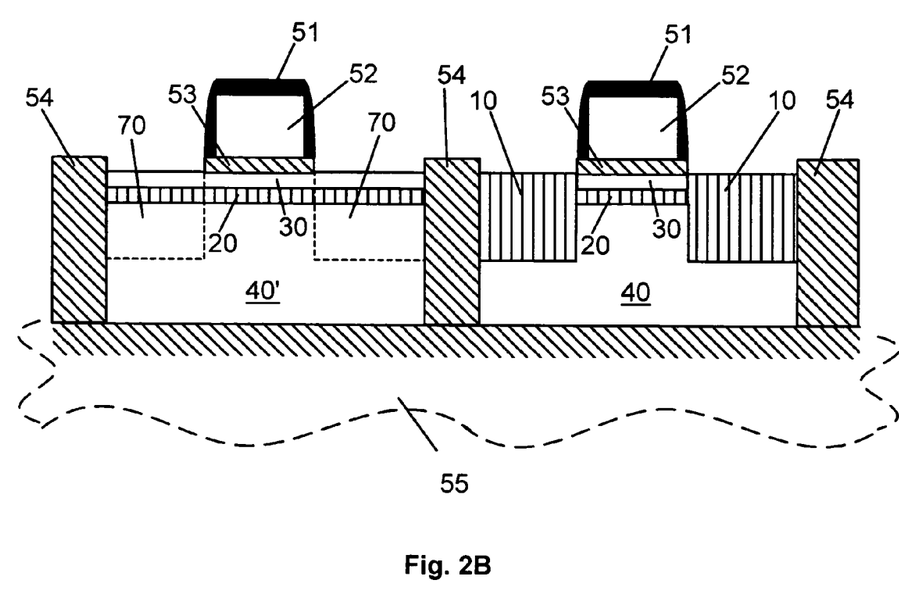

FIG. 2 schematically shows exemplary embodiments of a Si based heterojunction source/drain field device in complementary configurations. FIG. 2A shows two heterojunction source/drain field devices in complementary configuration (CMOS), namely p-type MOS and n-type MOS. One can have a CMOS where both type of devices are of the same character—i.e., both PMOS and NMOS having heterojunction source/drains, with one device having a n-type conductivity Si body 40, and the second device having a p-type conductivity Si body 40'. In one embodiment, both the PMOS and the NMOS have the heterojunction and the metallurgical junction coinciding with a tolerance of less than about 10 nm, and preferably less than about 5 nm. Alternatively, one can have CMOS configurations in which both PMOS and NMOS have SiGe heterojunction source/drain, but only the PMOS device have the substantial coincidence, less than about 10 nm, and preferably less than about 5 nm of tolerance between the heterojunction and the metallurgical junction.

FIG. 2B shows another representative embodiment when only the PMOS device has a heterojunction source/drain 10 with the substantially coinciding heterojunction and metallurgical junction within less than about 10 nm, and preferably less than about 5 nm of tolerance. In this case, however, the NMOS device does not have SiGe in the source 70 and drain 70, although it has the SiGe layer 20 and Si layer 30. Omitting the SiGe source/drain 10 from the NMOS device may have advantages. For example, the compressively strained epitaxial SiGe source/drain will cause some compressive stress in the silicon body near the gate edges after the cooling down from the epitaxial SiGe growth temperature, typically about at 500–600° C. This will cause the SiGe near the gate edges to be even more compressively strained. This additional compressive strain is actually advantageous for the PMOS, resulting in even higher hole mobility in the p-channel. However, the compressive strain in the Si n-channel of the NMOS will lower the electron mobility compared to bulk silicon. The effect may become more dominant for shorter gate lengths. Therefore, this representative embodiment of a CMOS in FIG. 2B where the NMOS has conventional source and drain 70 with the SiGe layer 20 and Si layer 30, has superior performance due to the strength of the PMOS device with a heterojunction source/drain 10. In a further representative embodiment, the PMOS device with a heterojunction source/drain 10 and the substantially coinciding heterojunction and metallurgical junction to within less than about 10 nm, and preferably less than about 5 nm of tolerance, can be paired up with any conventional NMOS device to form a CMOS configuration.

One advantage of having a PFET device with a heterojunction source/drain and with the substantially coinciding heterojunction and metallurgical junction is that additionally to the built-in potential by the p/n junction between the n type Si body 40 and the p-type SiGe source/drain 10, the band offset at the strained SiGe/Si interface 111 provides a potential barrier for holes and it does not vary with the drain bias such that the drain-induced barrier lowering and off-state leakage current can be reduced significantly for the PFET.

The advantage to the PFET arising from the increased hole mobility can be further enhanced by orienting devices according to crystallographic planes and directions. Since hole mobility is known to be generally higher on a (110) surface and electron mobility is known to be generally higher on a (100) surface, the CMOS may have a hybrid crystal orientation configuration such that the PFET is on (110) surface and the NFET is on (100) surface. In general it can be advantageous to orient both the PMOS and NMOS devices with their surface plane 60 (FIG. 1C) lying essentially in any of the main crystallographic directions: (100), (110), and (111). In addition, on a typical (100) wafer surface, the channels can be laid out such that the current flow is along the <100> and/or <110> direction, whichever has the higher carrier mobility for holes and electrons. The local stress may have a dependency on the channel direction and crystal orientation.

The advantages for both PFET and NFET devices having a strained SiGe source/drain are numerous, as recounted now. The part of device series resistance which is caused by the source/drain is lower due to higher solubility of B and P in SiGe compared to Si. Next, the contact resistance can be smaller due to the smaller band gap of SiGe. Furthermore in SOI embodiments floating body effects are reduced because the hot carriers generated by impact ionization near the drain can diffuse through the barrier into the source due to the reduced barrier height of the narrower band-gap in SiGe. This effect occurs in both PFET and NFETs. Also, the source/drain breakdown (BVds) can significantly be improved. For ultra-thin fully depleted SOI, the raised SiGe source/drain of FIG. 1C can be used. The strain in SiGe will be maintained as long as its thickness is under the critical thickness.

One aspect of the present invention provides for the fabrication of the heterojunction source/drain for FETs by epitaxial deposition of the source/drain material. Such epitaxial deposition can be achieved with desired material purity, crystalline quality, and control, for instance, by molecular beam epitaxy (MBE), or various types of chemical vapor deposition (CVD).

Such a method of fabricating source/drain by epitaxial deposition is not confined to the Si, SiGe material system, but can be applied to a wide variety of devices, for instance for the III-V semiconductor family. Thus, a source and a drain are formed generally by epitaxial deposition of a first material which forms a heterojunction with a second material, which second material constitutes the body of the FET device. If advantageous, such as in the case for the SiGe source/drain PMOS of FIG. 1, one can further include the fabrication step of providing a channel between the source and the drain, such that the channel consists essentially of the first material, namely the material of the source/drain. Alternatively, or together with the first material channel, one can carry out the step of providing a channel between the source and the drain which is essentially of the second material, namely the same as the device body. Furthermore, the precise control afforded in MBE and/or CVD allows for doping the source and drain such that the body is provided with one conductivity type and the source and the drain are provided with an opposing conductivity type, forming a metallurgical junction between the body and the source and the drain, and furthermore having the heterojunction and the metallurgical junction coinciding with a close tolerance. Such a close tolerance in state of the art FETs is desirable to be less than about 10 nm, and preferably less than about 5 nm.

Figure 3A:
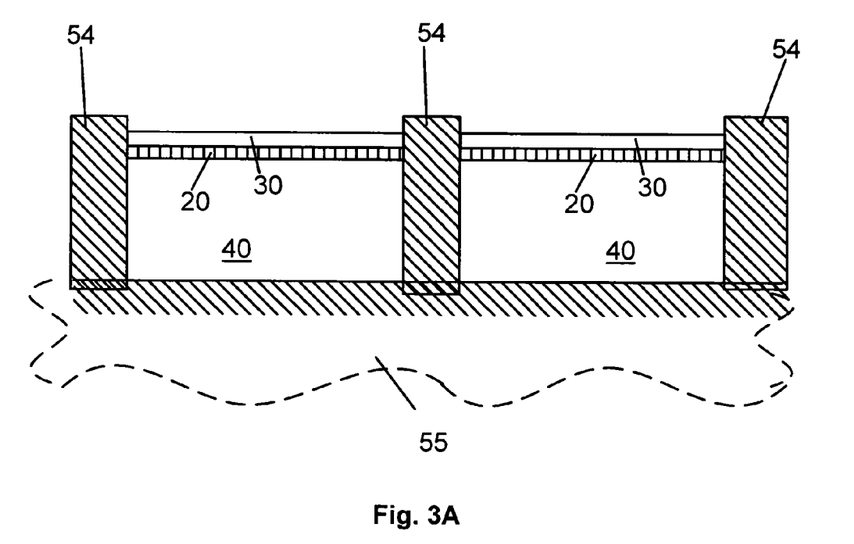
FIG. 3A–3E shows processing steps in the fabrication of an exemplary embodiment of a heterojunction source/drain field device.
Figure 3B:
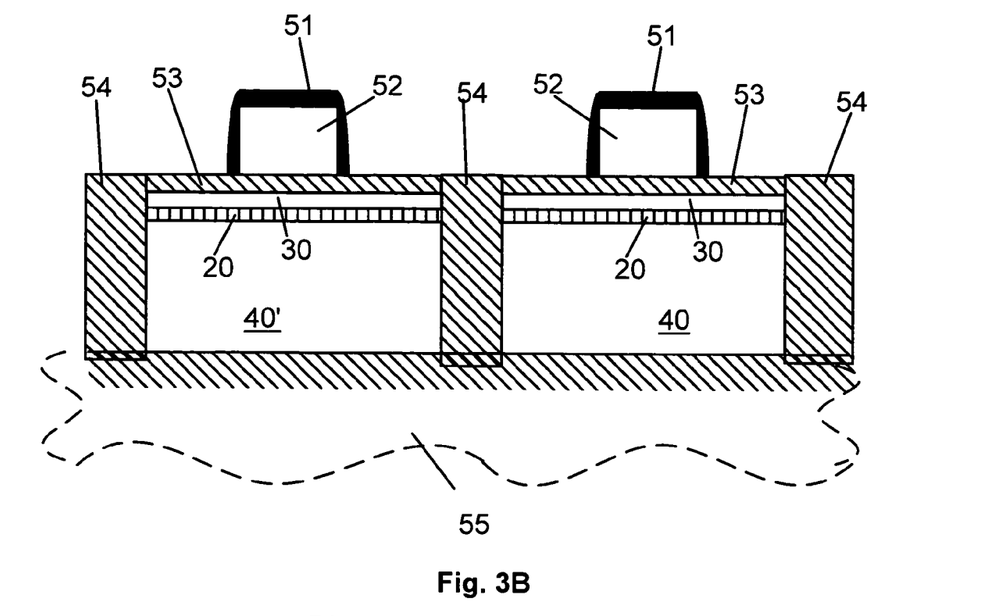
Figure 3C:
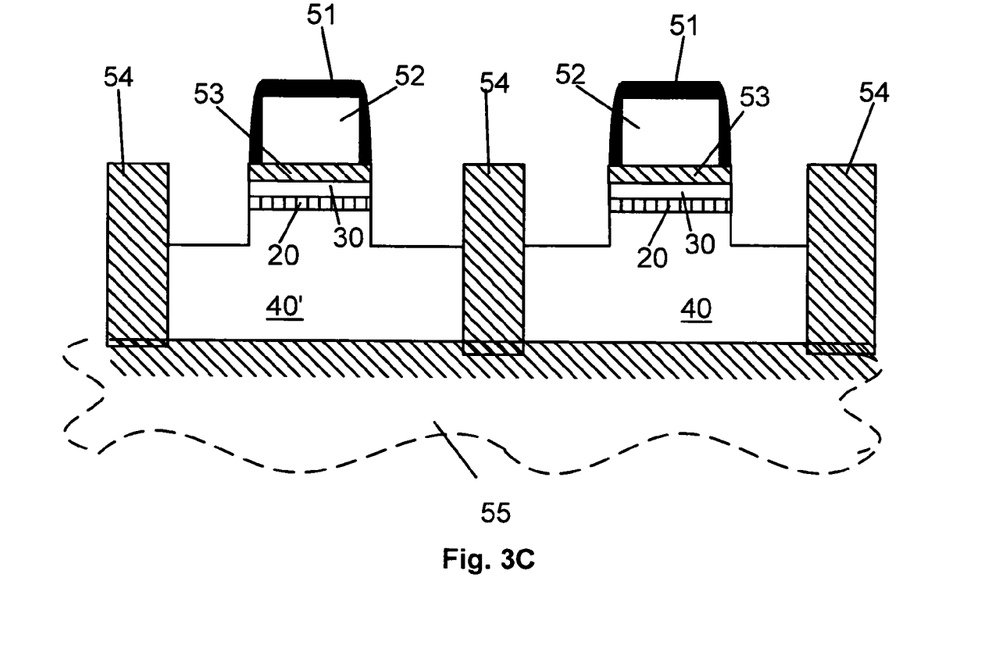
Figure 3D:
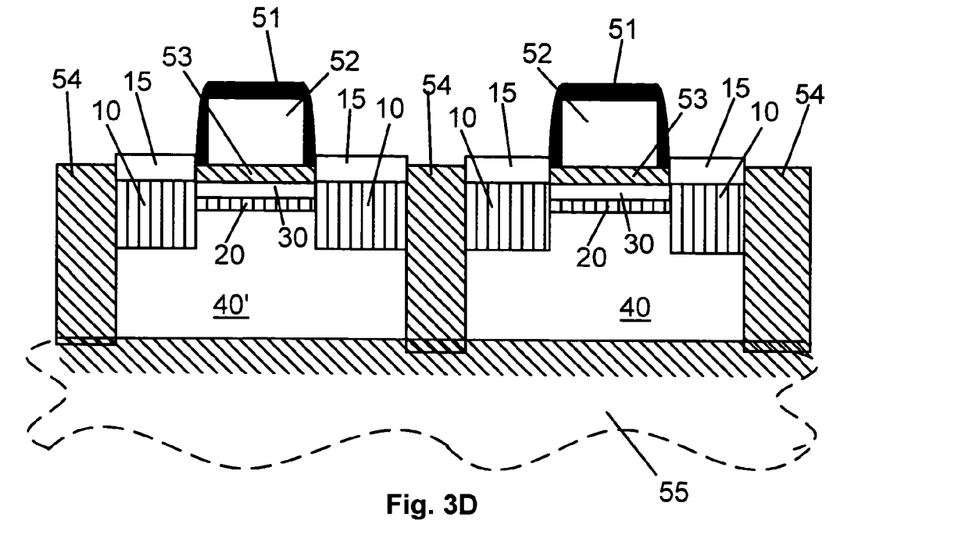
Figure 3E:
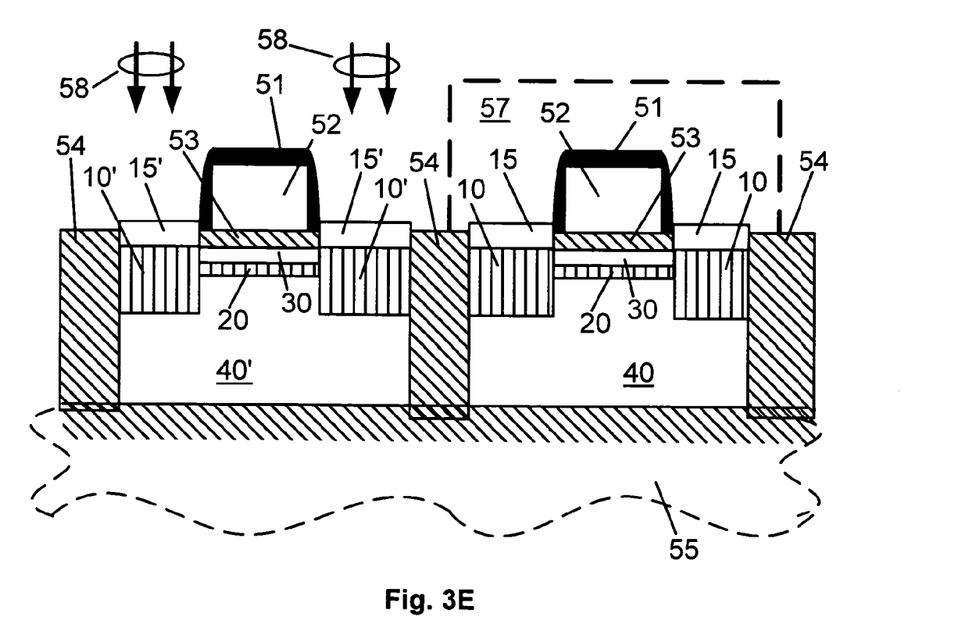
Figure 4A:
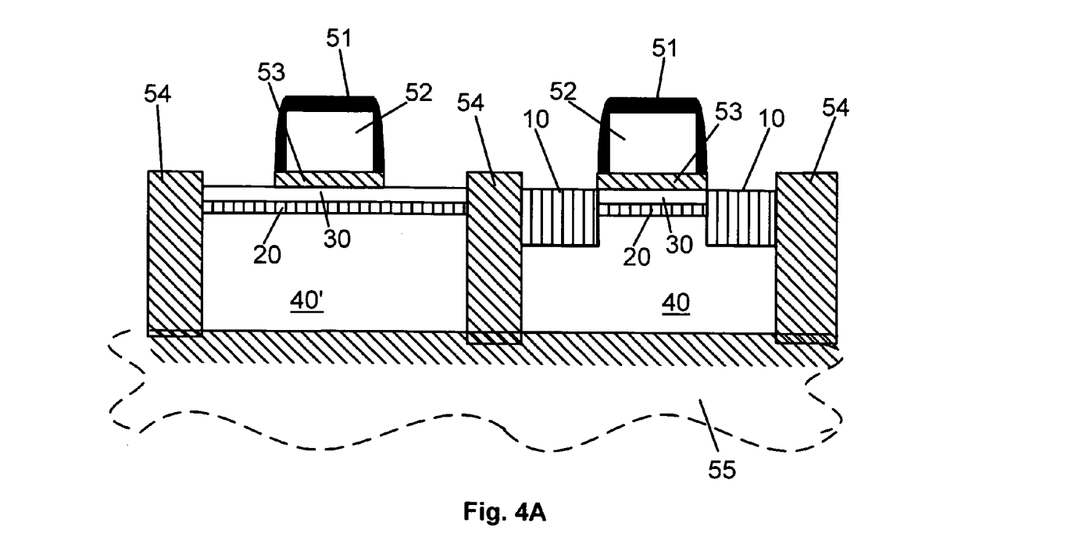
FIG. 4A–4B shows processing steps in the fabrication of an alternate exemplary embodiment of a heterojunction source/drain field device.
Figure 4B:
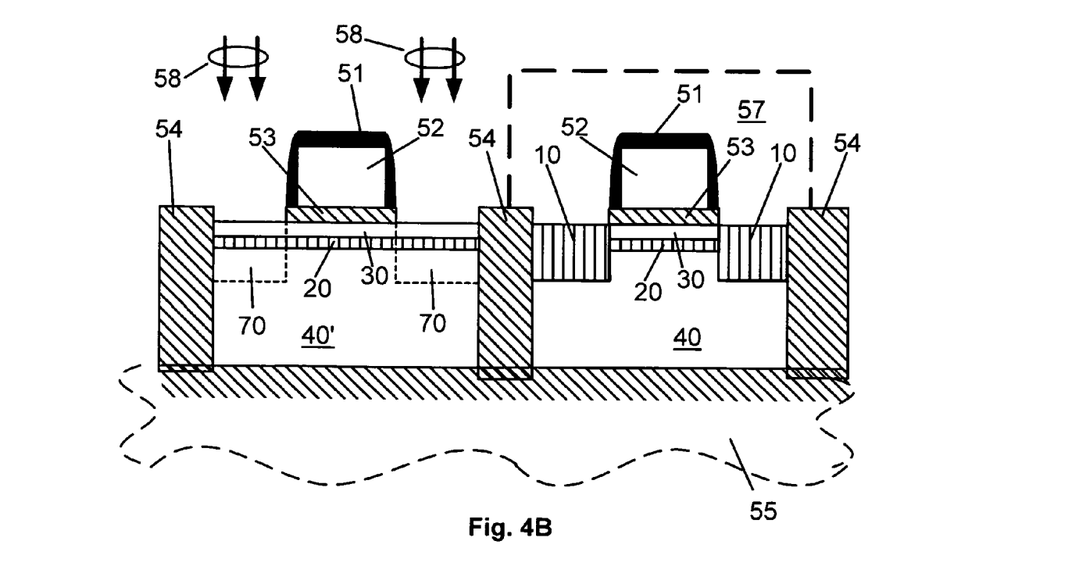

FIG. 3 and FIG. 4 show processing steps in the fabrication of exemplary embodiments of a heterojunction source/drain field device. The CMOS processing of a SiGe heterojunction source/drain field device can follow the many well established steps of CMOS processing known in the art. Only those steps that are unique to the heterojunction source/drain device are discussed and shown on FIG. 3 and FIG. 4. FIG. 3 and FIG. 4 show processing steps for the exemplary embodiment of a non-fully depleted SOI devices, as on FIG. 1B. However, in other exemplary embodiments, such as bulk devices, or fully depleted SOI devices, the specific steps for the heterojunction source/drain are the same.

FIG. 3A shows the fabrication after performing shallow trench 54 isolation in the Si body 40 which is disposed on an insulating material 55, and having the SiGe epi layer 20 and Si epi layer 30 already deposited. The order of isolation and epi growth can be selected to suit a particular desired processing sequence. One can carry out the growth of the epi layers 20 and 30 before, or after, the fabrication of the shallow trench isolation 54.

FIG. 3B shows the process after several more processing steps known in the art have been carried out. CMOS well implants and threshold adjust implants have been done, accordingly the Si body becomes of two type of conductivity n and p, type 40 and 40'. Gate dielectric 53, typically an oxide, has been grown. Gates 52 are deposited and patterned, and gate covers/spacers 51 are formed. FIG. 3C shows the source/drain regions being recessed to make room for the subsequent deposition of SiGe material. Such recessing/etching can be carried with techniques known in the art, such as reactive ion etching, and/or various wet etchings.

FIG. 3D shows a selective epitaxy with in-situ p-doped SiGe alloy into the recessed source/drain regions. The p-doped epi goes into both the PMOS and the NMOS yielding the identical source/drains 10 in both devices. The in-situ doped deposition of the SiGe alloy allows for sufficient control of the doping profiles resulting in substantial coincidence between the heterojunction and the metallurgical junction. In an exemplary embodiment this selective epitaxy of the source and drain can be carried out by ultra high vacuum chemical vapor deposition (UHV-CVD) with $SiH_4$, $Si_2H_4$, or $GeH_4$ precursor in a temperature range of about 400–650° C., typically about 550° C. To control the metallurgical junction position, the film can be in-situ boron doped with $B_2H_5$ added during the epitaxy.

This figure also indicates representatively a capping step yielding epitaxial Si cap layers 15 on top of the SiGe source and drain 10. The epitaxy of the Si cap layer 1 follows the epitaxy of the SiGe epitaxy of the source and drain. Such Si cap layers can facilitate contact to the device. The thickness of the Si cap layer can be relatively relaxed, typically between 2 nm and 30 nm. Although the step of depositing such a Si cap layer 15 is indicated only in FIG. 3D, somebody skilled in the art would notice, that it can part of the fabrication sequences of other representative embodiments, as well.

FIG. 3E shows the final steps in such a preferred embodiment. While the PMOS is masked 57, the NMOS source/drain regions are implanted 58 with an n-type species, such as phosphorus, or arsenic for example. The implanted dose is high enough to override the p-dopants and convert the SiGe source/drain of the NMOS into n-type 10' material, and the Si cap layer into highly n-doped 15'. The activation of this implant 58 is typically done with rapid thermal annealing, which allows for relatively precise control of the metallurgical junction location. In an exemplary embodiment rapid thermal anneal conditions can be about 1050–1100° C. for less than 10 sec. Or, one can use laser anneal or flash anneal to achieve even shorter annealing times.

There can be variations on the epi deposition and source/drain doping steps. If need arises instead of p-doped SiGe epitaxy, one can carry out undoped SiGe epitaxy and implant and activate the source/drain for both the PMOS and NMOS devices. For some situations one can even use n-type epi deposition. For one ordinarily skilled in the art further possible variations on such steps will be apparent.

FIG. 4 shows processing steps in the fabrication of an alternate exemplary embodiment of a heterojunction source/drain field device. Since as mentioned before the main beneficiary of the SiGe heterojunction source/drain is the PFET device, it is possible to omit the heterojunction from the NFET altogether, in order to avoid strain arising from the SiGe source/drain, as discussed in reference to FIG. 2B. FIG. 4A shows the devices at an intermediate state of processing, with all steps before the source/drain recession carried out as shown in FIG. 3, with the SiGe epi layer 20 and the Si epi layer 30 present in the NMOS. However the source/drain recessing and SiGe source/drain epi steps are performed only for the PMOS. This results in the situation shown in FIG. 4A, with the PMOS having the SiGe epi source/drain 10 in place, and the NMOS without source and drain. The next step shown in FIG. 4B is similar to the one of FIG. 3E. The PMOS is masked 57, and the source/drain of the NFET is implanted 58. The difference between this embodiment and that of FIG. 3E is that the implant 58 now simply goes into the Si Body 40', resulting in regular source/drain 70, with no heterojunction being formed with the Si body 40'.

Figure 5:
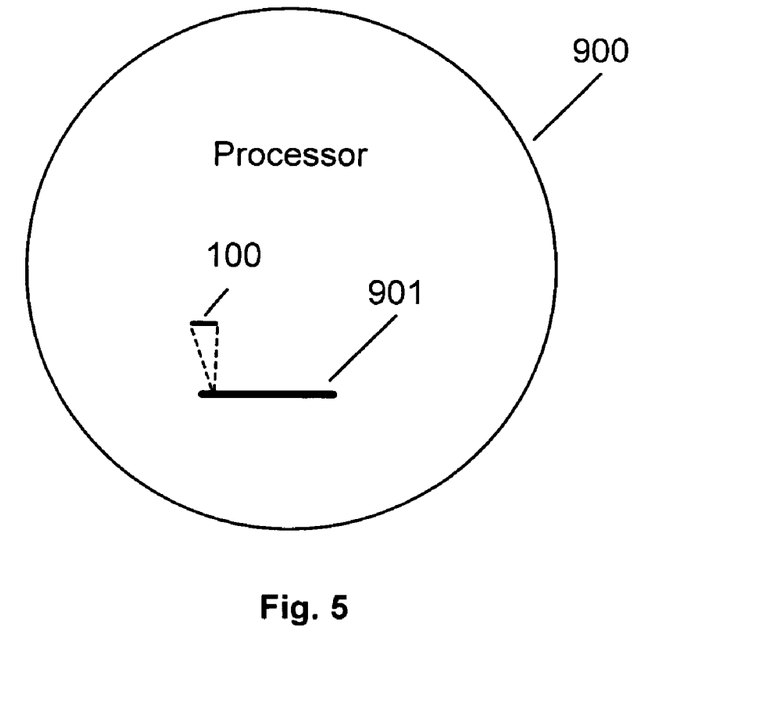
FIG. 5 shows a symbolic view of a processor containing a chip which contains a heterojunction source/drain field device.

FIG. 5 shows a symbolic view of a processor containing a chip which contains a heterojunction source/drain field device. Such a processor 900 has at least one chip 901, which contains at least one field effect device 100 having a SiGe heterojunction source/drain and with the coinciding heterojunction and metallurgical junction to within less than about 10 nm, and preferably less than about 5 nm of tolerance. The processor 900 can be any processor which can benefit from the SiGe heterojunction source/drain device 100. These devices form part of the processor in their multitude on one or more chips 901. In a representative embodiment these SiGe heterojunction source/drain field effect devices 100 are fabricated in an SOI technology.

Representative embodiments of processors manufactured with SiGe heterojunction source/drain field effect devices are digital processors, typically found in the central processing complex of computers; mixed digital/analog processors, which benefit significantly from the high mobility of the carriers in p-type SiGe heterojunction source/drain field effect devices; and in general any communication processor, such as modules connecting memories to processors, routers, radar systems, high performance video-telephony, game modules, and others.

Many modifications and variations of the present invention are possible in light of the above teachings, and could be apparent for those skilled in the art. The scope of the invention is defined by the appended claims.

We claim:

1. A field effect device, comprising:
   a crystalline Si body of one conductivity type;
   a SiGe layer epitaxially disposed on said Si body;
   a Si layer epitaxially disposed on said SiGe layer;
   an insulating layer, on top of which said Si body is disposed thereon; and
   a source and a drain comprising SiGe in an epitaxial relation with said Si body and connected to each other by said SiGe layer and said Si layer, wherein said source and said drain are formed in recessed source/drain regions of said body, wherein said recessed source/drain regions penetrate all the way down to said insulating layer, said source and said drain having a conductivity type opposite to that of said Si body and each forming a heterojunction and a metallurgical junction with said Si body, wherein said heterojunction coincides with said metallurgical junction with a tolerance of less than about 10 nm.

2. The device of claim 1, wherein said insulating layer is $SiO_2$.

3. The device of claim 1, wherein said Si body conductivity is n-type, and wherein a hole device current is confined predominantly in said SiGe layer.

4. The device of claim 3, wherein said hole device current is directed along one of a <100> or a <110> crystallographic direction.

5. The device of claim 1, wherein said Si body conductivity is p-type, and an electron device current is confined predominantly in said Si layer.

6. The device of claim 1, wherein said SiGe layer and said SiGe in said source and said drain are compressively strained.

7. The device of claim 1, wherein said SiGe layer is between about 5 nm and 15 nm thick.

8. The device of claim 1, wherein said SiGe layer has a Ge concentration which substantially equals a Ge concentration in said SiGe in said source and said drain.

9. The device of claim 8, wherein said Ge concentration in said SiGe layer is between about 15% and 50%.

10. The device of claim 1, wherein said device has a top surface plane that lies essentially in one of a (100), (110) or (111) crystallographic plane.

11. The device of claim 1, wherein said source and said drain further comprise an epitaxial Si cap layer disposed on top of said strained SiGe, wherein said Si cap layer is between about 2 nm and 30 nm thick.

12. The device of claim 1, wherein said Si body conductivity is n-type, and said device is connected in a complementary circuit configuration with an NMOS device.

13. A PMOS field effect device, comprising:
    a crystalline Si body;
    a SiGe layer epitaxially disposed on said Si body;
    a Si layer epitaxially disposed on said SiGe layer;
    an insulating layer, on top of which said Si body is disposed thereon; and
    a source and a drain of p-type conductivity comprising SiGe in an epitaxial relation with said Si body and connected to each other by said SiGe layer and said Si layer, wherein said p-type source and said p-type drain are formed in recessed source/drain regions of said body, wherein said recessed source/drain regions penetrate all the way down to said insulating layer, said source and said drain each forming a heterojunction and a metallurgical junction with said n-type Si body, wherein said heterojunction coincides with said metallurgical junction with a tolerance of less than about 10 nm.

14. The device of claim 13, wherein said insulating layer is $SiO_2$.

15. The device of claim 13, wherein said SiGe layer is between about 5 nm and 15 nm thick.

16. The device of claim 13, wherein said SiGe layer has a Ge concentration of between about 15% and 50%.

17. The device of claim 16, wherein said Ge concentration in SiGe layer substantially equals a Ge concentration in said SiGe in said source and said drain.

18. A processor, comprising:
    at least one chip, wherein said chip comprises at least one field effect device, and
    wherein said at least one field effect device comprise:
    a crystalline Si body of one conductivity type;
    a SiGe layer epitaxially disposed on said Si body;
    a Si layer epitaxially disposed on said SiGe layer;
    an insulating layer, on top of which said Si body is disposed thereon; and
    a source and a drain comprising SiGe in an epitaxial relation with said Si body and connected to each other by said SiGe layer and said Si layer, wherein said source and said drain are formed in recessed source/drain regions of said body, wherein said recessed source/drain regions penetrate all the way down to said insulating layer, said source and said drain having a conductivity type opposite to that of said Si body and each forming a heterojunction and a metallurgical junction with said Si body, wherein said heterojunction coincides with said metallurgical junction with a tolerance of less than about 10 nm.

* * * * *

UNITED STATES PATENT AND TRADEMARK OFFICE
CERTIFICATE OF CORRECTION

PATENT NO. : 7,057,216 B2  Page 1 of 1
APPLICATION NO. : 10/698122
DATED : June 6, 2006
INVENTOR(S) : Qiqing Christine Ouyang and Xiangdong Chen It is certified that error appears in the above-identified patent and that said Letters Patent is hereby corrected as shown below:

Title page, item [57] Abstract: should read as follow:

A structure, and method of fabrication, for high performance field effect devices is disclosed. The MOS structures include a crystalline Si body of one conductivity type, a strained SiGe layer epitaxially grown on the Si body serving as a buried channel for holes, a Si layer epitaxially grown on the SiGe layer serving as a surface channel for electrons, and a source and a drain containing an epitaxially deposited, strained SiGe of opposing conductivity type than the Si body. The SiGe source/drain forms a heterojunction and a metallurgical junction with the Si body that coincide with each other with a tolerance of less than about 10nm, and preferably less than about 5nm. The heterostructure source/drain is instrumental in reducing short channel effects. These structures are especially advantageous for PMOS due to increased hole mobility in the compressively strained SiGe channel. Representative embodiments include CMOS structures on bulk and on SOI.

Signed and Sealed this

Tenth Day of April, 2007

JON W. DUDAS
*Director of the United States Patent and Trademark Office*